United States Patent
Ryu (10) Patent No.: US 8,313,961 B2
(45) Date of Patent: Nov. 20, 2012

(54) APPARATUS AND METHOD FOR MANUFACTURING LIGHT-EMITTING DIODE

(75) Inventor: Beng So Ryu, Incheon-si (KR)

(73) Assignee: QMC Co., Ltd. (KR)

( * ) Notice: Subject to any disclaimer, the term of this patent is extended or adjusted under 35 U.S.C. 154(b) by 0 days.

(21) Appl. No.: 13/049,490

(22) Filed: Mar. 16, 2011

(65) Prior Publication Data

US 2011/0183449 A1   Jul. 28, 2011

Related U.S. Application Data

(63) Continuation of application No. PCT/KR2009/005347, filed on Sep. 21, 2009.

(30) Foreign Application Priority Data

Sep. 23, 2008  (KR) .................. 10-2008-0093223
Oct. 6, 2008   (KR) .................. 10-2008-0097806
Apr. 16, 2009  (KR) .................. 10-2009-0033107

(51) Int. Cl.
*H01L 33/00* (2010.01)

(52) U.S. Cl. .................. 438/22; 156/753; 257/E33.001
(58) Field of Classification Search .................. 156/712, 156/753, 930, 941; 257/E33.001; 438/22, 438/458, 464, 507
See application file for complete search history.

(56) References Cited

U.S. PATENT DOCUMENTS

| | | | |
|---|---|---|---|
| 6,864,158 B2* | 3/2005 | Ishida ............................ | 438/479 |
| 6,974,758 B2* | 12/2005 | Kelly et al. .................... | 438/458 |
| 7,727,790 B2* | 6/2010 | Zimmerman et al. ........... | 438/33 |
| 2007/0264806 A1* | 11/2007 | Park ............................... | 438/486 |
| 2008/0050895 A1* | 2/2008 | Miyairi et al. ................. | 438/507 |

* cited by examiner

*Primary Examiner* — Julio J Maldonado
*Assistant Examiner* — Daniel Shook
(74) *Attorney, Agent, or Firm* — Roetzel & Andress

(57) ABSTRACT

An apparatus and method for manufacturing a light emitting devices by separating a semiconductor layer from a substrate includes a laser beam source for emitting a laser beam, a mesh-typed mask having a plurality of apertures through which the laser beam passes to provide a plurality of unit beams; and an imaging lens for forming a plurality of beam spots by focusing the plurality of unit beams at an interface between a substrate and a semiconductor layer to separate the substrate from the semiconductor layer.

13 Claims, 11 Drawing Sheets

APPARATUS AND METHOD FOR MANUFACTURING LIGHT-EMITTING DIODE

This application is a continuation of copending International Patent Application No. PCT/KR2009/005347, filed on Sep. 21, 2009.

This application claims the benefit of Korean Patent Application No. 10-2008-0093223 filed on Sep. 23, 2008, Korean Patent Application No. 10-2008-0097806 filed on Oct. 6, 2008, Korean Patent Application No. 10-2009-0033107 filed on Apr. 16, 2009, and International Patent Application No. PCT/KR2009/005347 filed on Sep. 21, 2009, all of which are hereby incorporated by reference for all purposes as if fully set forth herein.

BACKGROUND OF THE INVENTION

1. Field of the Invention

Embodiments of the invention relates to an apparatus and method for manufacturing a light-emitting diode, and more particularly to an apparatus and method for manufacturing a light-emitting diode, which is capable of separating a semiconductor layer from a substrate to manufacture a vertical type light-emitting diode.

2. Discussion of the Related Art

A light-emitting diode (hereinafter, referred to as "LED") is a well-known semiconductor device for converting electrical current into light. The LED emits light when electrons in an active layer made of a semiconductor material are excited from a valence band to a conduction band across a band gap so as to transit the valence band. This transition of the electrons enables the emission of light depending on the band gap energy. Thus, wavelength or color of the light emitted by the LED is determined based on the type of semiconductor material in the active layer since the band gap is one of the specific characteristics of different types of semiconductor materials.

The LED is used for emitting light in various colors, such as red, green, blue, and yellow. However, the LED has a limitation in that it is a monochromatic light source. There may be a requirement for the emission of white light, which includes all of the red, green, and blue lights. For example, a notebook computer using a liquid crystal display (hereinafter, referred to as "LCD") uses a backlight unit emitting white light. Typically, the white light is provided by an incandescent bulb or a fluorescent lamp. In the case of the incandescent bulb, it has the advantage of being inexpensive but the disadvantages of a very short lifetime and a low light-emitting efficiency. The fluorescent lamp has a higher light-emitting efficiency than the incandescent bulb but still has the disadvantage of a short lifetime. Further, the fluorescent lamp has the additional disadvantages of being relatively large, heavy, and requiring additional expensive electrical components, such as a stabilizer.

A white LED light source may be manufactured by closely positioning red, green, and blue LEDs, which each respectively emit light at an appropriate ratio. In the alternative, a phosphor covered blue LED can emit light that appears white. However, a process for manufacturing the blue LED is not easy since it is difficult to make good-quality semiconductor crystal with the appropriate band gap. Particularly, if using a compound semiconductor of indium phosphide (InP), gallium arsenide (GaAs), and gallium phosphide (GaP), it is difficult to realize a good quality blue LED. In spite of these difficulties, the GaN-based blue LED has been used commercially. A rapid development for technology of the GaN-based blue LED since 1994 has enabled the GaN-based blue LED to surpass the incandescent bulb or fluorescent lamp in terms of efficiency in the field of illumination.

In the case of the InP-based, GaAs-based, and GaP-based LEDs, the semiconductor layer is grown on a conductive substrate such that it is not difficult to manufacture a vertical type LED having a p-n junction structure with first and second electrodes on the top and bottom surfaces, respectively. However, the GaN-based LED uses an insulating substrate made of sapphire ($Al_2O_3$) so as to reduce a crystal defect that might occur during the epitaxial growth of GaN on the sapphire substrate. In this case, a horizontal type structure having both first and second electrodes formed on a top surface of the epitaxial GaN layer has been generally adopted since the sapphire substrate is non-conductive.

Figure 1:
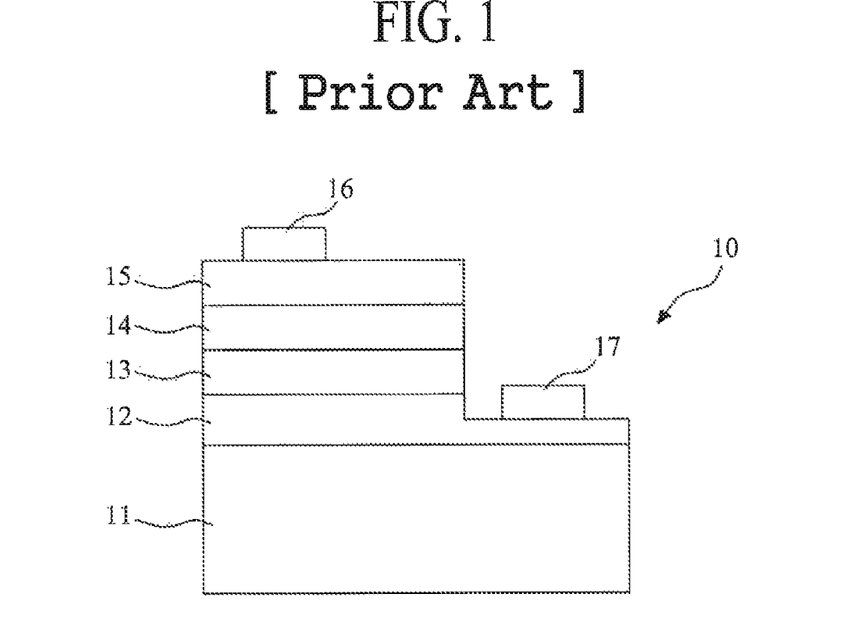
FIG. 1 is a cross-sectional view of a related art horizontal type LED.

FIG. 1 is a cross-sectional view of a related art horizontal type LED using a sapphire substrate. As shown in FIG. 1, which is a cross section view illustrating a related art LED 10, an n-GaN layer 12, an active layer 13 having multiple quantum wells, a p-GaN layer 14, and a transparent conductive layer 15 are formed sequentially on a sapphire substrate 11. A first electrode 16 is subsequently formed on a predetermined portion of the transparent conductive layer 15.

Photoresist patterns (not shown) are then formed on the transparent conductive layer 15 including the first electrode 16 by photolithography, wherein the photoresist patterns (not shown) are provided to expose predetermined portions of the transparent conductive layer 15 on which the first electrode 16 is not formed. The transparent conductive layer 15, the p-GaN layer 14, and the active layer 13 are selectively etched under such circumstance that the photoresist patterns are used as a mask. At this time, a portion of the n-GaN layer 12 is etched slightly. A wet etch is preferred to dry etch since GaN layer is difficult to etch. After removing the photoresist patterns by a stripping process, a second electrode 17 is formed on the exposed n-GaN layer 12.

Figure 2:
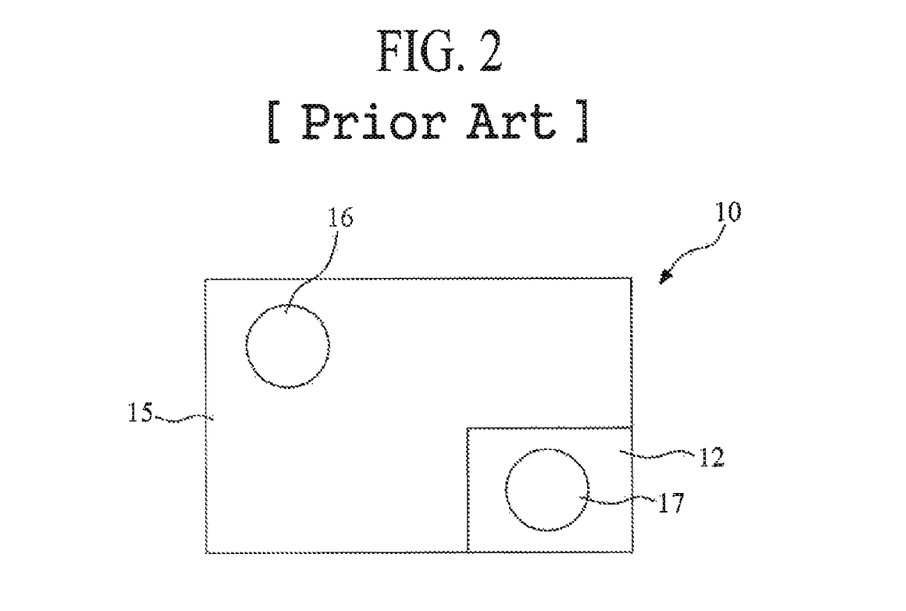
FIG. 2 is a plan view of a related art horizontal type LED.

FIG. 2 is a plan view of a related art horizontal type LED using a sapphire substrate. As shown in FIG. 2, in the case of the horizontal type structure, both the first and second electrodes 16 and 17 are on top surfaces. Accordingly, a chip size of the LED 10 should be large enough to ensure sufficient area for contacting the electrodes. The area for contacting electrodes acts as an obstacle to improvement in the output per unit area of a wafer. In addition, manufacturing cost is increased due to the complexity of the wire bonding to both the first and second electrodes 16 and 17 during the packaging process.

The use of a non-conductive sapphire substrate 11 makes it difficult to protect against externally-provided static electricity, thereby increasing failure possibility and lowering device reliability. Also, since the sapphire substrate 11 has low thermal conductivity, it is difficult to transfer heat generated by operation of the LED 10 to the external environment. Because of the low heat transfer capability in the non-conductive sapphire substrate 11, the amount of electric current that can be provided to the LED 10 is limited and thus the output power of the LED 10 is limited. To overcome the problems of the horizontal type LED 10 using the sapphire substrate 11, a vertical type LED, especially a vertical type LED in which the final product does not have a sapphire substrate, has been studied and researched actively.

Figure 3:
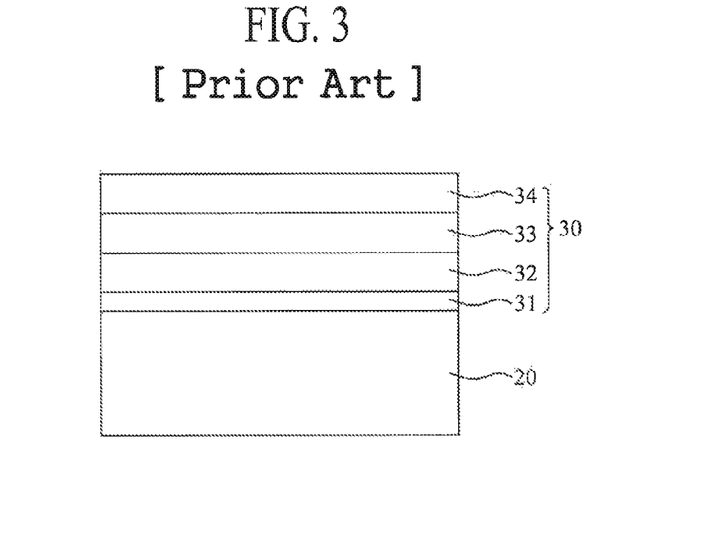
FIGS. 3 to 7 illustrate a related art process for manufacturing a vertical type LED.

FIGS. 3 to 7 illustrate sequential steps for manufacturing a vertical type LED. As shown in FIG. 3, serial GaN-based layers 30, including a GaN buffer layer 31, an n-GaN layer 32, a InGaN/GaN/AlGaInN active layer 33 having a multiple quantum well, and a p-GaN layer 34 are formed sequentially on a sapphire substrate 20 by a semiconductor deposition process, such as MOCVD (Metal Oxide Chemical Vapor Deposition) or MBE (Molecular Beam Epitaxy). When a thin film of GaN is grown directly on a sapphire ($Al_2O_3$) (001) substrate, a surface uniformity of the thin film might be adversely affected due to a lattice incoherency at the interface between the GaN and the sapphire substrate. In this respect, it is desirable to first form the GaN buffer layer 31 on the sapphire substrate 20, and then to form the serial GaN-based layers 30 on the GaN buffer layer 31. Typically, the sapphire substrate 20 has a thickness of about 330 to 430 μm, and an entire thickness of the serial GaN-based layers 30 is less than about 10 μm.

Figure 4:
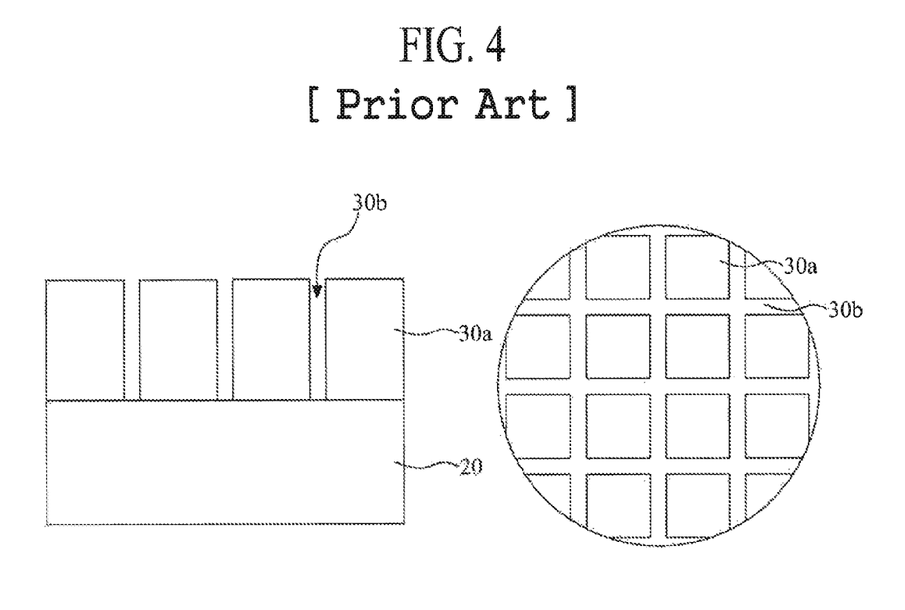

Then, as shown in FIG. 4, a plurality of trenches 30b are formed through the serial GaN-based layers 30 by an ICP RIE (Inductively Coupled Plasma Reactive Ion Etching) method. The trenches 30b define the individual LEDs. The trenches 30b make the individual LEDs have a shape of a square that is about 200 μm long and 200 μm wide. A trench 30b in and of itself has a width less than about 10 μm. Since the hardness of the serial GaN-based layers 30 is good, the trenches 30b are formed by RIE (Reactive Ion Etching), especially ICP RIE. To form the trenches 30b, a photoresist (not shown) is coated on the GaN-based layers 30 by spin coating, and then the photoresist is treated with a selective exposure and development process to form photoresist patterns (not shown). Then, the GaN-based layers 30 are partially etched by the ICP RIE using the photoresist patterns as an etching mask so as to form the plurality of trenches 30b.

A laser lift-off process is used to separate the sapphire substrate 20 from the GaN-based layers 30a. The laser can cause fractures or cracks in the GaN-based epitaxial layer as a result of stresses concentrated at the edge of the beam spot due to an inconsistent energy density distribution profile across the laser beam spot. A process of forming the trenches 30b prior to the laser lift-off process is known for addressing such cracks or fractures. That is, the stress causing the fractures or cracks of the GaN-based layers 30a is prevented by the trenches 30b when performing a laser lift-off process to separate the sapphire substrate 20 from the GaN-based layers 30a. Thus, it has been widely known that the process of forming the trenches 30b should be performed prior to the laser lift-off process.

Figure 5:
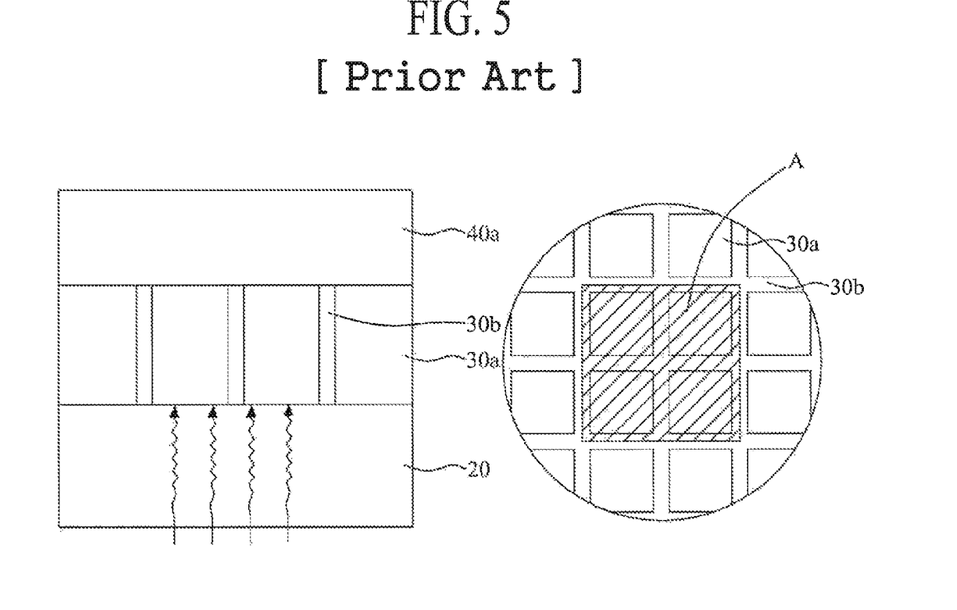

After forming the trenches 30b, as shown in FIG. 5, a conductive supporting layer 40 is formed on the GaN-based layers 30a. Then, the sapphire substrate 20 is separated from the GaN-based layers 30a. To separate the sapphire substrate 20 from the GaN-based layers 30, a laser beam passing through a beam homogenizer (not shown) is applied to the GaN-based layers 30a through the sapphire substrate 20 under such circumstances that the sapphire substrate 20 and the conductive supporting layers 40 are pulled in the opposite directions through the use of vacuum chucks (not shown) adhered thereon. Since stresses can occur at the edge of the laser beam spot (A), the edges of the laser beam spot (A) is positioned to be in the trenches 30b. The alignment of the laser beam edges in the trenches has difficulties in that precise adjustments are required in the timing of the laser beam pulse along with the movement of a stage on which a wafer is loaded thereon.

After the laser beam is sequentially applied to an entire area of an interface between the sapphire substrate 20 and the GaN-based layers 30a through the sapphire substrate 20, the sapphire substrate 20 is separated from the GaN-based epitaxial layer 30a. In this case, the remaining epitaxial layer 30a includes the GaN buffer layer 31, which was in contact with the sapphire substrate 20. Thus, it is necessary to additionally perform a process to remove the GaN buffer layer 31.

Figure 6:
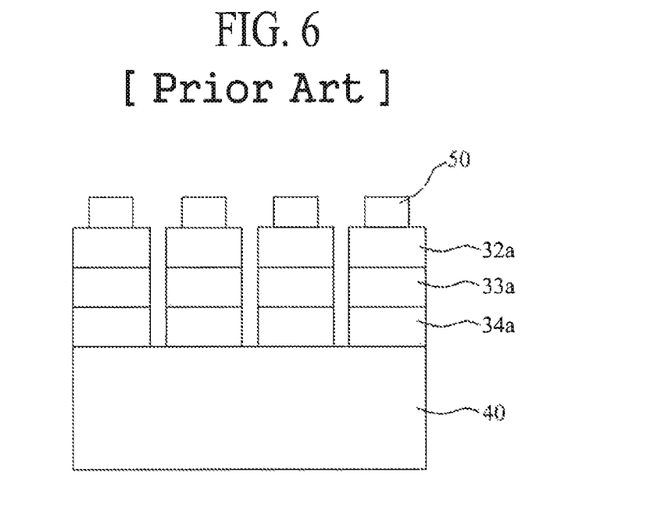
Figure 7:
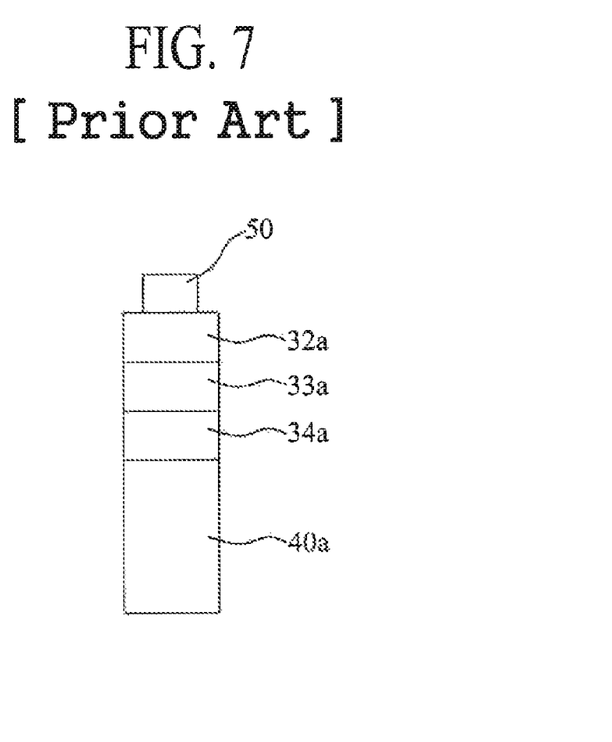

As shown in FIG. 6, after removing the GaN buffer layer 31, a contact layer 50 is formed on the respective n-GaN layers 32a. After forming the contact layer 50, the individual LEDs are divided by a dicing process. The dicing process may be performed by various mechanical or chemical methods. FIG. 7 illustrates a cross section view illustrating the final product divided into individual LEDs.

SUMMARY OF THE INVENTION

Accordingly, embodiments of the invention are directed to an apparatus and method for manufacturing an LED that substantially obviates one or more of the problems due to limitations and disadvantages of the related art.

An object of the embodiments of the invention is to provide an apparatus and method for manufacturing an LED, which is capable of improving the yield by omitting a process of forming a trench in a GaN-based epitaxial layer before a process of separating a sapphire substrate from the GaN-based epitaxial layer.

Another object of embodiments of the invention is to provide an apparatus and method for manufacturing an LED, which is capable of preventing damage to a GaN-based epitaxial layer caused by imprecisely aligning an edge of beam spot within a trench of the GaN-based epitaxial layer for a laser lift-off process of separating a sapphire substrate from the GaN-based epitaxial layer, thereby realizing a simpler and easier process.

Another object of embodiments of the invention is to provide an apparatus and method for manufacturing an LED, which is capable of improving the yield by omitting a process for removing a GaN buffer layer after separating a sapphire substrate from a GaN-based epitaxial layer.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the invention, as embodied and broadly described, there is provided an apparatus for manufacturing a light-emitting diode that includes a laser beam source for emitting a laser beam, a mesh-typed mask having a plurality of apertures through which the laser beam passes to provide a plurality of unit beams, and an imaging lens for forming a plurality of beam spots by focusing the plurality of unit beams at an interface between a substrate and a semiconductor layer to separate the substrate from the semiconductor layer.

In another aspect, there is provided a method for manufacturing a light-emitting diode forming a semiconductor layer on a substrate that includes forming a semiconductor layer on a substrate, forming a conductive supporting layer on the semiconductor layer, forming a plurality of unit beams by passing a laser beam through a mesh-typed mask having a plurality of apertures, and forming a plurality of beam spots at an interface between the semiconductor layer and the substrate, wherein the plurality of beam spots are formed by passing the plurality of unit beams through an imaging lens.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF THE PREFERRED EMBODIMENTS

Reference will now be made in detail to the preferred embodiments of the invention, examples of which are illustrated in the accompanying drawings. The invention may, however, be embodied in many different forms and should not be construed as being limited to the embodiments set forth herein; rather, these embodiments are provided so that this disclosure will be thorough and complete, and will fully convey the concept of the invention to those skilled in the art. In the drawings, the thicknesses of layers and regions are exaggerated for clarity. Like reference numerals in the drawings denote like elements.

Figure 8:
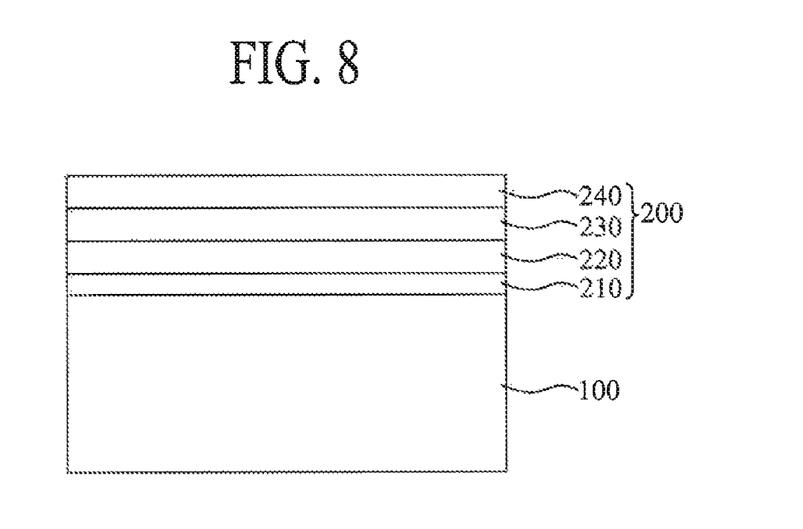
FIGS. 8 to 12 illustrate a process for manufacturing a vertical type LED according to an embodiment of the invention.

FIGS. 8 to 12 illustrate a process for manufacturing a vertical type LED according to an embodiment of the invention. As shown in FIG. 8, serial GaN-based epitaxial layers 200 including a GaN buffer layer 210, an N-type GaN layer 220, a InGaN/GaN/AlGaInN active layer 230 having a multiple quantum well, and a P-type GaN layer 240 are sequentially formed on a sapphire substrate 100 by a semiconductor deposition technology, such as MOCVD (Metal Oxide Chemical Vapor Deposition) or MBE (Molecular Beam Epitaxy).

If a thin film of GaN is grown directly on a sapphire ($Al_2O_3$) (001) substrate, surface uniformity of the thin film might be adversely affected due to a lattice incoherency at the interface between the GaN and the sapphire substrate. Thus, it is desirable to first form a GaN buffer layer 210 on the sapphire substrate 100, and then to sequentially form the other GaN-based layers 220, 230, and 240 on the GaN buffer layer 210. Typically, the sapphire substrate 100 has a thickness of about 330 to 430 µm, and an entire thickness of the sequentially formed GaN-based layers 200 is less than about 10 µm.

Figure 9:
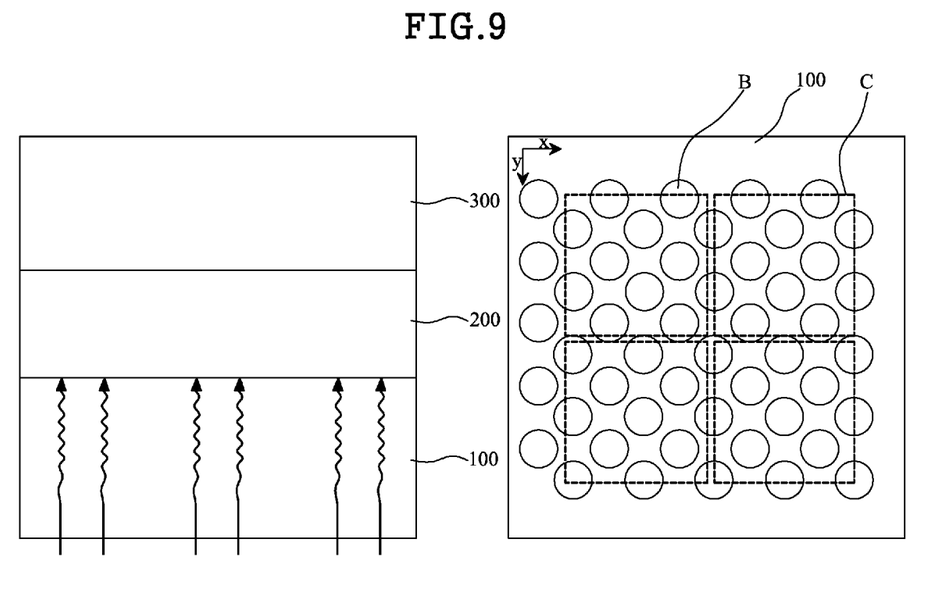

As shown in FIG. 9, a conductive supporting layer 300 is formed on the GaN-based epitaxial layer 200. The conductive supporting layer 300 may be formed by physical vapor deposition, electroplating, or bonding. The conductive supporting layer 300 can have about 500 µm thickness or less, but not necessarily. The conductive supporting layer 300 is formed of metal, such as Cu, Au, or Al. However, the conductive supporting layer 300 may be formed of any material having electrical conductivity, such as Si. To enhance the bond between the GaN-based epitaxial layer 200 and the conductive supporting layer 300, an adhesive layer (not shown), including Cr or Au, may be additionally provided therebetween.

Then, the sapphire substrate 100 is separated from the GaN-based epitaxial layer 200 by a laser lift-off process. This separation is performed by applying a laser beam to the GaN-based epitaxial layer 200 through the sapphire substrate 100. According to one embodiment of the invention, the process of separating the sapphire substrate 100 includes a step for forming a plurality of beam spots (B) on an interface between the GaN-based epitaxial layer 200 and the sapphire substrate 100 by making the laser beam first pass through a mesh-typed mask having a plurality of apertures.

Figure 13:
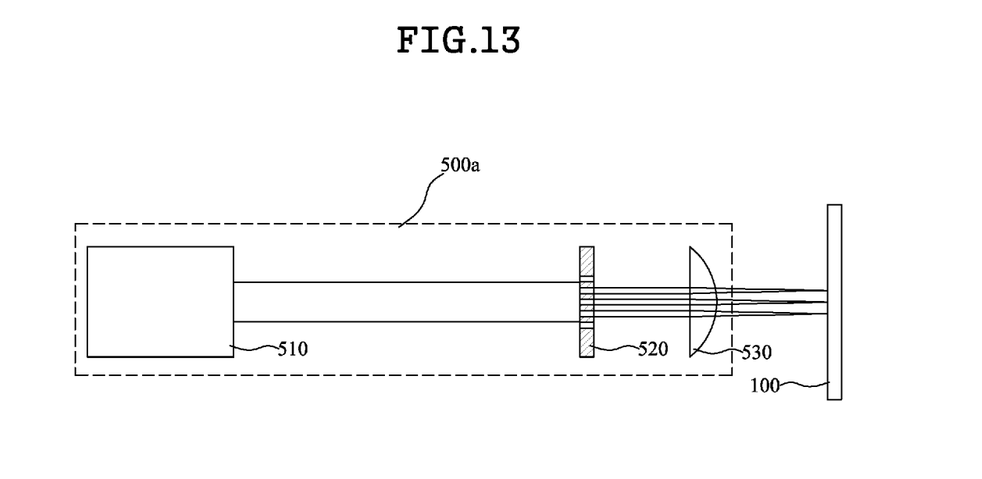
FIG. 13 illustrates a first apparatus for manufacturing an LED according to a first embodiment of the invention.
Figure 14:
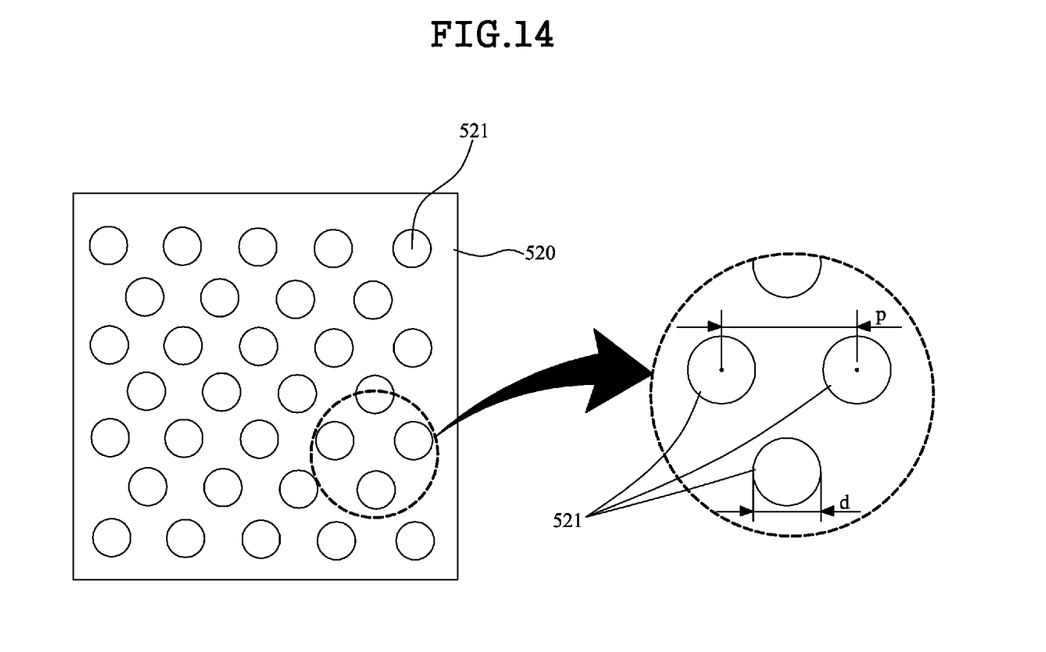
FIG. 14 illustrates a mesh-typed mask according to an embodiment of the invention.

FIG. 13 illustrates a first apparatus 500a for manufacturing an LED according to the first embodiment of the invention, and FIG. 14 illustrates a mesh-typed mask 520 according to an embodiment of the invention. The first apparatus 500a according to the first embodiment of the invention is a laser lift-off apparatus, which includes a laser beam source 510 for emitting laser beam; a mesh-typed mask 520 provided with a plurality of apertures 521 for selectively passing the laser beam emitted from the laser beam source 510; and an imaging lens 530 for forming a plurality of beam spots (B) by focusing the laser beam passing through the plurality of apertures 521 in the mesh-typed mask 520 on a target.

The wavelength of the laser beam may be between about 150 nm and about 1100 nm. The laser beam source 510 may be KrF eximer laser or ArF eximer laser. The target corresponds to the GaN-based epitaxial layer 200 formed on the sapphire substrate 100. The plurality of beam spots (B) are formed at the interface between the GaN-based epitaxial layer 200 and the sapphire substrate 100. That is, the laser beam is first divided into a plurality of unit beams by passing through the plurality of apertures 521 in the mesh-typed mask 520, the divided unit beams are focused by the imaging lens 530, and then the focused unit beams are applied to the GaN-based epitaxial layer 200 through the sapphire substrate 100, thereby forming a plurality of beam spots (B) at the interface between the GaN-based epitaxial layer 200 and the sapphire substrate 100.

According to one embodiment of the invention, each of the beam spots (B) is formed in a circular shape satisfying the following formula:

$$1.67 \times 10^3 \times T \times E_d^{-1} \leq R \leq 20 \times 10^3 \times T \times E_d^{-1}$$

wherein R represents the radius (m) of the circular shape, T represents the thickness (m) of the GaN-based epitaxial layers 200, and $E_d$ represents the energy density ($J/cm^2$) of the beam spot (B). Generally, the thickness of the GaN-based epitaxial layer 200 is about 5 to 10 µm, and the appropriate energy density of the beam spot (B) is about 0.6 to 2 $J/cm^2$. Thus, each beam spot (B) has the semi-diameter of about 0.4 to 32 µm, and more preferably about 5 to 20 µm, but not necessarily.

To uniformly disperse the stress applied to the GaN-based epitaxial layer 200, it is preferable that the beam spot (B) have the circular shape, but not necessarily. Also, if the semi-diameter of the beam spot (B) is less than the aforementioned range, the size of the beam spot (B) becomes excessively small, thereby lowering the efficiency and yield. If the semi-diameter of the beam spot (B) is above the aforementioned range, the size of the beam spot (B) becomes excessively large as compared with the energy density of the beam spot (B), whereby the stress is excessively concentrated at the edge of the beam spot (B), which might cause the fracture or crack in the GaN-based epitaxial layer 200.

According to one embodiment of the invention, when applying the laser beam to the sapphire substrate 100, the size of the beam spot (B) is adjusted to be proportional to the thickness of the GaN-based epitaxial layer 200 on the sapphire substrate 100, and to be inversely proportional to the energy density of the beam spot (B), thereby preventing the fracture or crack from occurring in the GaN-based epitaxial layer 200 by stresses concentrated at the edge of the beam spot (B).

According to embodiments of the invention, there is no requirement for forming a trench (through which the stress concentrated at the edge of the beam spot is discharged) in the GaN-based epitaxial layer 200 before the laser lift-off process for separating the sapphire substrate 100 from the GaN-based epitaxial layer 200. Also, since the plurality of beam spots (B) having the appropriate size are formed from the laser beam, it is possible to maximize efficiency and yield.

The size of the beam spot (B) can be adjusted by changing the position of the mesh-typed mask 520. In this case, all optical elements have to be re-aligned based on the change in position of the mesh-typed mask 520, and the energy density of the beam spot (B) applied to the sapphire substrate 100 is changed. Thus, it is more desirable that the size of the beam spot (B) should be adjusted by changing the size of the aperture 521 in the mesh-typed mask 520, but not necessarily.

If each aperture 521 has a diameter 'D', it is preferable that a pitch between the neighboring apertures 521 be less than '2D' in terms of efficiency and yield.

As shown in FIG. 9, it is unnecessary to precisely align the respective edges of the plurality of beam spots (B), formed at the interface between the GaN-based epitaxial layer 200 and the sapphire substrate 100, with the edges of respective LEDs (C) or trenches. Thus, there is no requirement for precise control in the timing of laser beam irradiation and wafer movement such that the process is simplified and can be easily done with minimum errors.

Figure 10:
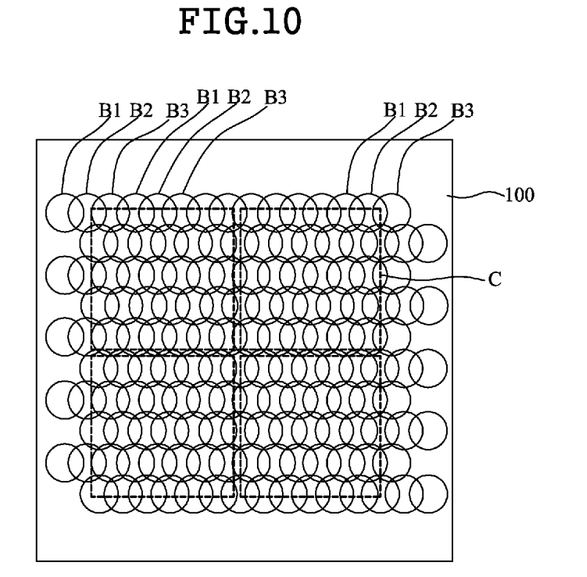
Figure 11:
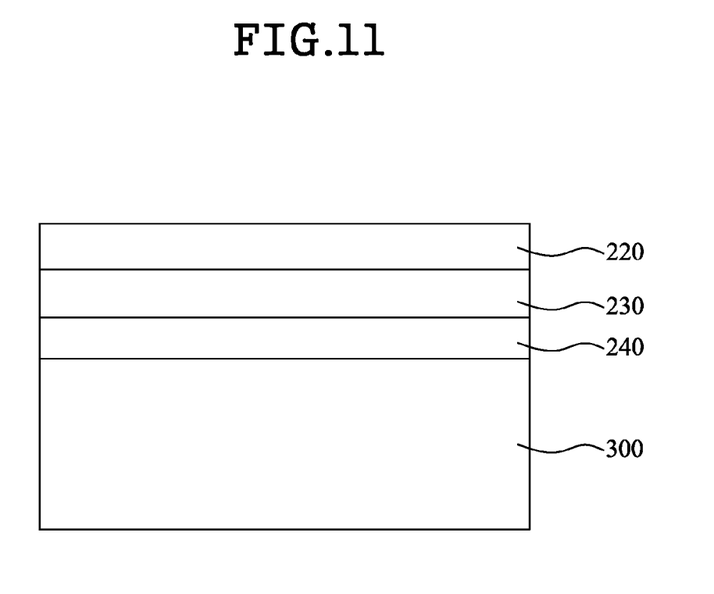

As shown in FIGS. 10 and 11, while the wafer is moved in the X-axis direction, a first pulse for forming the plurality of beam spots (B1), a second pulse for forming the plurality of beam spots (B2), and a third pulse for forming the plurality of beam spots (B3) are sequentially applied to the wafer, to thereby separate the sapphire substrate 100 from the GaN-based epitaxial layer 200 containing the individual LEDs (C). Selectively, while a stage with the wafer loaded thereon is moved in the Y-axis direction or X-Y axis direction, the laser beam is applied thereto.

When laser beam pulses are applied according to the aforementioned method, the entire area of the interface between the GaN-based epitaxial layer 200 and the sapphire substrate 100 may be repeatedly irradiated with the laser beam. In this case, the GaN buffer layer 210 being in direct contact with the sapphire substrate 100 can be completely removed by the laser lift-off process. According to embodiments of the invention, there is no requirement for an additional process to remove the GaN buffer layer 210 after the laser lift-off process, thereby maximizing efficiency and yield.

The circular shape of the beam spot (B) enables uniform dispersion of the stress applied to the GaN-based epitaxial layer 200 so that the stress concentration at the edge of the beam spot can be minimized. However, the geometrical arrangement of the circular-shaped beam spots (B) may cause different numbers of laser-beam irradiation applications according to the respective positions of the sapphire substrate 100. That is, the number of laser-beam irradiation applications may be different according to the corresponding position of the respective areas of the sapphire substrate 100.

To consistently apply the laser beam to the entire area of the sapphire substrate 100 by the same number of laser-beam irradiation applications, the beam spot is formed in a rectangular shape. For providing the rectangular-shaped beam spot, the mesh-typed mask 520 has rectangular-shaped apertures. In this case, the size of the rectangular-shaped beam spots may be the same as or smaller than the size of the circular-shaped beam spots, to thereby preventing the GaN-based epitaxial layer 200 from being damaged by the stress concentrated at the edge of the beam spot.

Figure 12:
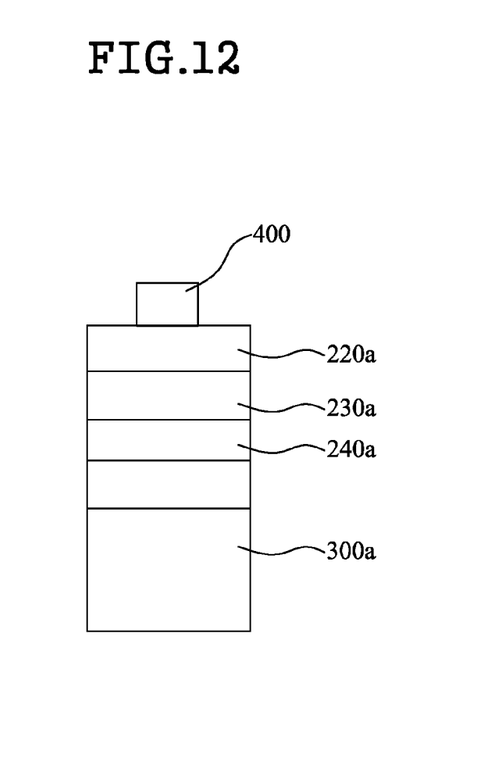

After the laser lift-off process, a contact layer 400 is formed on the N-type GaN layer 220, and then the conductive supporting layer 300 along with the GaN-based layers 220, 230, and 240 are divided into the individual LEDs by a dicing process. The dicing process may be performed by various mechanical or chemical methods. FIG. 12 illustrates a cross section view illustrating the final product divided into individual LEDs.

Figure 15:
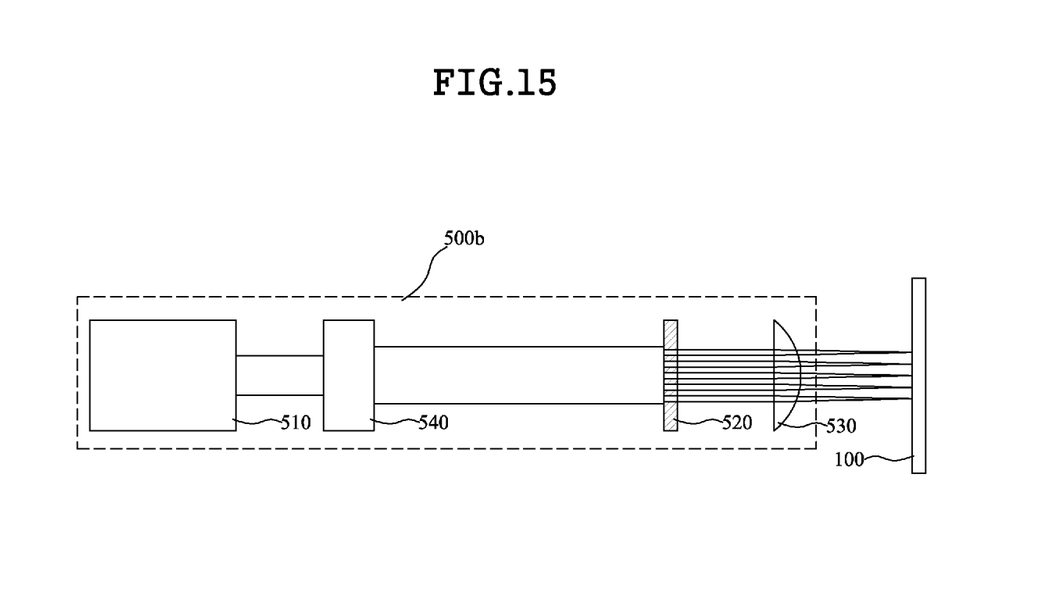
FIG. 15 illustrates a second apparatus for manufacturing an LED according to a second embodiment of the invention.

FIG. 15 illustrates an apparatus 500b for manufacturing an LED according to the second embodiment of the invention. The second apparatus 500b according to the second embodiment of the invention further includes a beam expanding telescope (BET) 540 positioned between a laser beam source 510 and a mesh-typed mask 520. The second apparatus 500b is provided with the same optical elements as those included in the first apparatus 500a according to the first embodiment of the invention, except for a beam expanding telescope (BET) 540 positioned between a laser beam source 510 and a mesh-typed mask 520.

The beam expanding telescope (BET) 540 expands laser beam emitted from the laser beam source 510, to thereby expand a laser-beam irradiation area. As the expanded laser beam passes through more apertures 52 in the mesh-typed mask 520 as compared to the first embodiment of the invention, more beam spots (B) are formed on a sapphire substrate 100, thereby improving yield.

Figure 16:
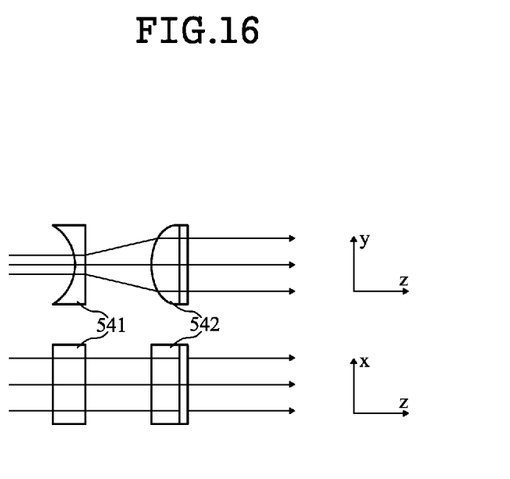
FIGS. 16 to 19 illustrate various embodiments of beam expanding telescope (BET) according to embodiments of the invention.

FIGS. 16 to 19 illustrate various embodiments of the beam expanding telescope (BET) 540 according to embodiments of the invention. As shown in FIG. 16, the beam expanding telescope (BET) 540 includes a cylindrical concave lens 514 and a cylindrical convex lens 542 aligned in sequence. Thus, the laser beam incident on the beam expanding telescope (BET) 540 is expanded only in the single axis (Y-axis). For expanding the laser beam in the single axis, the beam expanding telescope (BET) 540 may include two cylindrical convex lenses, wherein the laser beam is focused on an optical path between the two cylindrical convex lenses.

Figure 17:
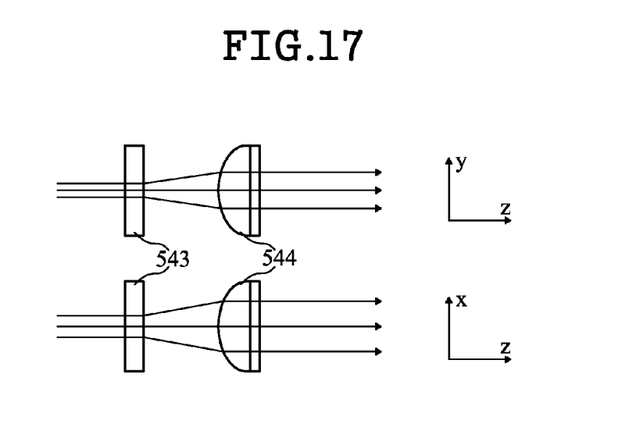

As shown in FIG. 17, the beam expanding telescope (BET) 540 includes a spherical concave lens 543 and a spherical convex lens 544 aligned in sequence. Thus, the laser beam incident on the beam expanding telescope (BET) 540 is expanded in the both axes (X-Y axes).

Figure 18:
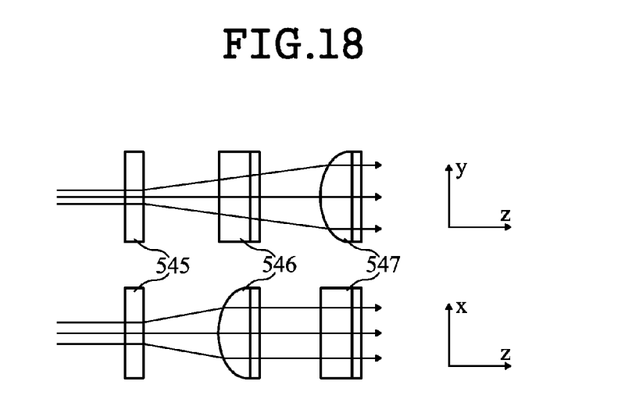

As shown in FIG. 18, the beam expanding telescope (BET) 540 includes a spherical concave lens 545 and two cylindrical convex lenses 546 and 547 aligned in sequence. In this case, the two cylindrical convex lenses 546 and 547 are perpendicular in their curvature directions so that the laser beam incident on the beam expanding telescope (BET) 540 is expanded in the both axes.

Figure 19:
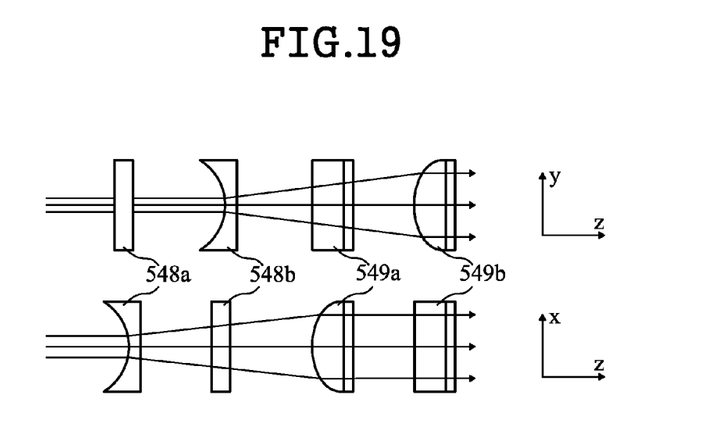

As shown in FIG. 19, the beam expanding telescope (BET) 540 includes two cylindrical concave lenses 548a and 548b and two cylindrical convex lenses 549a and 549b aligned in sequence. Since the curvature direction of each lens is perpendicular to a curvature direction of the neighboring lens, the laser beam incident on the beam expanding telescope (BET) 540 is expanded in both axes.

FIGS. 20 to 23 illustrate apparatuses for manufacturing an LED according to the third to sixth embodiments of the invention.

Figure 20:
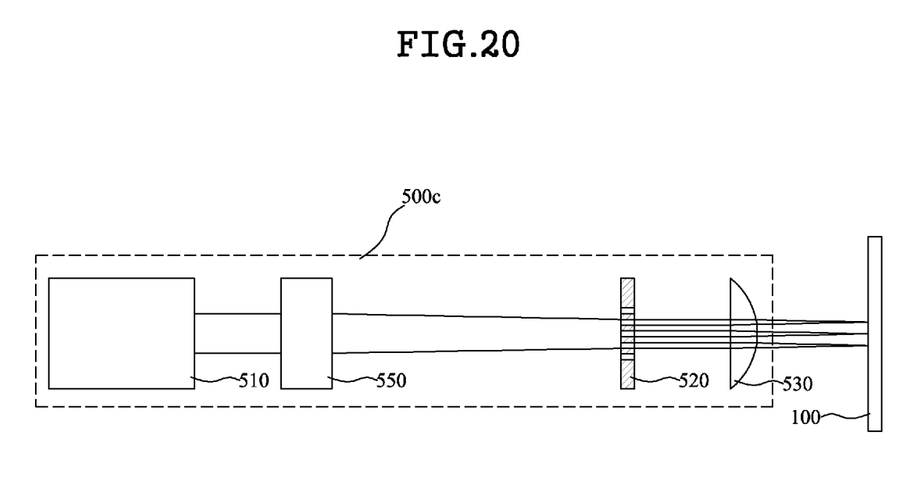
FIGS. 20 to 23 illustrate apparatuses for manufacturing an LED according to the third to sixth embodiments of the invention.

As shown in FIG. 20, the third apparatus 500c for manufacturing an LED according to the third embodiment of the invention includes a field lens 550 positioned between a laser beam source 510 and a mesh-typed mask 520. The third apparatus 500c is provided with the same optical elements as those included in the first apparatus 500a according to the first embodiment of the invention, except for the field lens 550 is positioned between a laser beam source 510 and a mesh-typed mask 520.

The field lens 550 may be a convex lens or concave lens. If the field lens 550 is a concave lens, the laser beam passing through the field lens 550 passes through more apertures 520 in the mesh-typed mask 520 as compared with the first embodiment of the invention, whereby the number of beam spots (B) formed on a sapphire substrate 100 is relatively high, but the energy density of each beam spot (B) becomes low. If the field lens 550 is the convex lens, the number of beam spots (B) formed on a sapphire substrate 100 is relatively low, but the energy density of each beam spot (B) becomes high.

Figure 21:
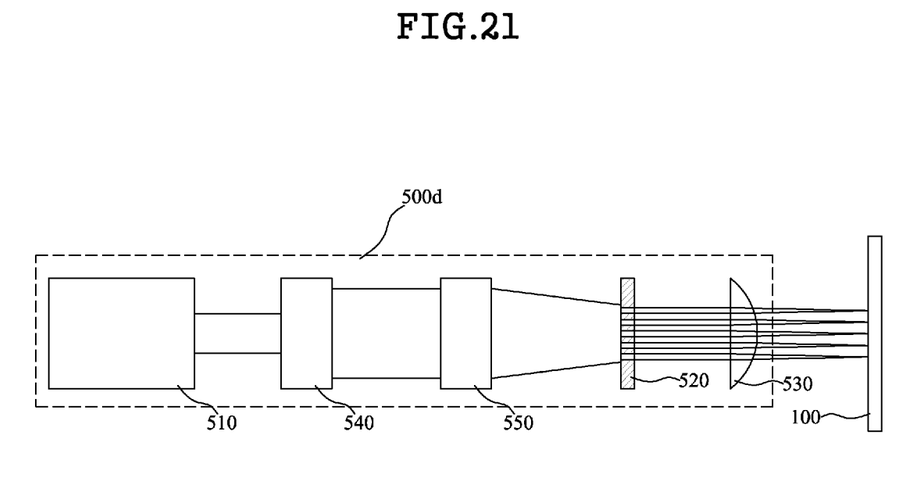

As shown in FIG. 21, the fourth apparatus 500d for manufacturing an LED according to the fourth embodiment of the invention further includes a beam expanding telescope (BET) 540 positioned between a laser beam source 510 and a field lens 550. The fourth apparatus 500d according to the fourth embodiment of the invention is provided with the same optical elements as those included in the apparatus 500c according to the third embodiment of the invention except that the beam expanding telescope (BET) 540 is positioned between a laser beam source 510 and a field lens 550. As mentioned above, the beam expanding telescope (BET) 540 expands the laser beam in a single axis or both axes. The beam expanding telescope (BET) 540 enables more beam spots (B) to be formed on a sapphire substrate 100, thereby improving yield.

Figure 22:
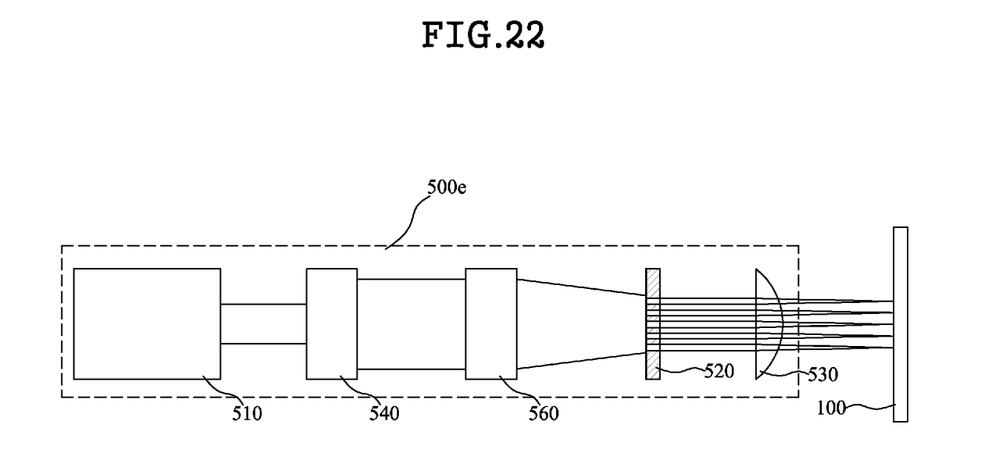

As shown in FIG. 22, the fifth apparatus 500e for manufacturing an LED according to the fifth embodiment of the invention further includes a beam homogenizer 560 positioned between a beam expanding telescope (BET) 540 and a mesh-typed mask 520. The fifth apparatus 500e according to the fifth embodiment of the invention is provided with the same optical elements as those included in the apparatus 500b according to the second embodiment of the invention, except for a beam homogenizer 560 positioned between a beam expanding telescope (BET) 540 and a mesh-typed mask 520. The beam homogenizer 560 improves uniformity in energy intensity of the laser beam expanded by the beam expanding telescope (BET) 540, whereby beam spots (B) with uniform energy intensity profile are formed on a sapphire substrate 100.

Figure 23:
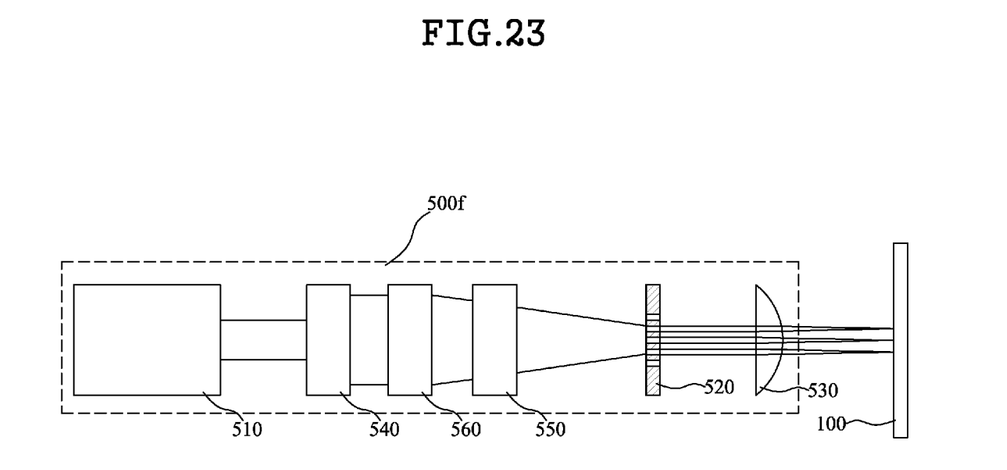

As shown in FIG. 23, the sixth apparatus 500f for manufacturing an LED according to the sixth embodiment of the invention further includes a field lens 550 positioned between a beam homogenizer 560 and a mesh-typed mask 520, for adjusting an interval therebetween. Except for the field lens 550, the sixth apparatus 500f according to the sixth embodiment of the invention is provided with the same optical elements as those included in the fifth apparatus 500e according to the fifth embodiment of the invention.

The apparatus and method for manufacturing an LED according to the invention can improve the yield by omitting the troublesome process for forming the trench in the GaN-based epitaxial layer 200 before the process for separating the sapphire substrate 100 from the GaN-based epitaxial layer 200. Also, the apparatus and method for manufacturing an LED according to embodiments of the invention is capable of preventing damage to the GaN-based epitaxial layer 200, the damage caused by imprecisely aligning the edge of beam spot (B) with the trench in the GaN-based epitaxial layer for the laser lift-off process of separating the sapphire substrate 100 from the GaN-based epitaxial layer 200, thereby realizing simplification and easiness in process. Further, after separating the sapphire substrate 100 from the GaN-based epitaxial layer 200, there is no requirement for a process of removing the GaN buffer layer 210, which enables an improved yield.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. An apparatus for manufacturing an LED comprising:
a laser beam source for emitting laser beam;
a mesh-typed mask having a plurality of apertures for selectively passing the laser beam; and
an imaging lens for forming a plurality of beam spots by focusing the laser beam passing through the mesh-typed mask, so as to separate a substrate from a semiconductor layer formed on the substrate,
wherein each of the apertures is formed in a circular shape and a size of the aperture is adjustable so as to form the beam spot in a circular shape satisfying the following formula:

$$1.67 \times 10^3 \times T \times E_d^{-1} < R < 20 \times 10^3 \times T \times E_d^{-1}$$

wherein R represents a semi-diameter (m) of the circular shape, T represents a thickness (m) of the semiconductor layer, and $E_d$ represents an energy density (J/cm$^2$) of the beam spot.

2. The apparatus of claim 1, further comprising a beam expanding telescope positioned between the laser beam source and the mesh-typed mask.

3. The apparatus of claim 2, further comprising a field lens positioned between the beam expanding telescope and the mesh-typed mask.

4. The apparatus of claim 2, further comprising a beam homogenizer positioned between the beam expanding telescope and the mesh-typed mask.

5. The apparatus of claim 1, further comprising a beam homogenizer positioned between the laser beam source and the mesh-typed mask.

6. The apparatus of claim 1, further comprising a field lens positioned between the laser beam source and the mesh-typed mask.

7. The apparatus of claim 1, wherein the plurality of beam spots are formed on an interface between the semiconductor layer and the substrate.

8. The apparatus of claim 1, wherein each of the apertures is formed in a circular shape with a diameter 'D', and wherein a pitch between the neighboring apertures is less than '2D'.

9. The apparatus of claim 1, wherein a wavelength of the laser beam is between about 150 nm and about 1100 nm.

10. A method for manufacturing an LED comprising:
forming a semiconductor layer on a substrate;
forming a conductive supporting layer on the semiconductor layer;
forming a plurality of unit beams by passing a laser beam through a mesh-typed mask having a plurality of apertures having a circular shape; and
separating the substrate from the semiconductor layer by forming a plurality of beam spots at an interface between the semiconductor layer and the substrate, wherein the plurality of beam spots are formed by passing the plurality of unit beams through an imaging lens, wherein a size of the aperture of the mesh-type mask is adjusted such that each of the beam spot is formed at the interface in a circular shape satisfying the following formula:

$$1.67 \times 10^3 \times T \times E_d^{-1} < R < 20 \times 10^3 \times T \times E_d^{-1}$$

wherein R represents a semi-diameter (m) of the circular shape, T represents a thickness (m) of the semiconductor layer, and $E_d$ represents an energy density (J/cm$^2$) of the beam spot.

11. The method of claim 10, further comprising moving a stage on which the substrate is loaded.

12. The method of claim 10, wherein the semiconductor layer comprises a buffer layer formed directly on the substrate, and wherein the step of separating the substrate further comprises removing the buffer layer.

13. The method of claim 10, wherein each aperture is formed in a circular shape having a diameter 'D', and wherein a pitch between the neighboring apertures is less than '2D'.

* * * * *